United States Patent
Hess et al.

(10) Patent No.: US 8,988,957 B2
(45) Date of Patent: Mar. 24, 2015

(54) SENSE AMPLIFIER SOFT-FAIL DETECTION CIRCUIT

(71) Applicant: Apple Inc., Cupertino, CA (US)

(72) Inventors: Greg M Hess, Mountain View, CA (US); James E Burnette, II, San Jose, CA (US)

(73) Assignee: Apple Inc., Cupertino, CA (US)

(*) Notice: Subject to any disclaimer, the term of this patent is extended or adjusted under 35 U.S.C. 154(b) by 248 days.

(21) Appl. No.: 13/670,813

(22) Filed: Nov. 7, 2012

(65) Prior Publication Data

US 2014/0126312 A1    May 8, 2014

(51) Int. Cl.
  *G11C 29/00* (2006.01)
  *H01L 21/66* (2006.01)
  *G11C 29/02* (2006.01)

(52) U.S. Cl.
  CPC .............. *H01L 22/12* (2013.01); *G11C 29/026* (2013.01); *H01L 2924/0002* (2013.01)
  USPC .. 365/201; 365/189.02; 365/207; 365/210.12

(58) Field of Classification Search
  USPC .......................... 365/201, 189.02, 207, 210.12
  See application file for complete search history.

(56) References Cited

U.S. PATENT DOCUMENTS

| | | | |
|---|---|---|---|
| 5,381,374 A * | 1/1995 | Shiraishi et al. | 365/185.25 |
| 6,169,696 B1 * | 1/2001 | Bissey | 365/201 |
| 8,014,224 B2 * | 9/2011 | Yoshinaga et al. | 365/226 |
| 8,126,045 B2 | 2/2012 | Bulzacchelli et al. | |
| 8,179,731 B2 | 5/2012 | Vigoda et al. | |
| 8,406,072 B2 * | 3/2013 | Kim et al. | 365/201 |
| 8,559,249 B1 * | 10/2013 | Seningen et al. | 365/189.15 |
| 2009/0059686 A1 | 3/2009 | Sung | |
| 2010/0199020 A1 | 8/2010 | Lin et al. | |
| 2013/0223158 A1 * | 8/2013 | Seningen et al. | 365/189.02 |

* cited by examiner

*Primary Examiner* — Pho M Luu
(74) *Attorney, Agent, or Firm* — Meyertons, Hood, Kivlin, Kowert & Goetzel, P.C.

(57) ABSTRACT

A sense amplifier test circuit that may allow for detecting soft failures may include a voltage generator circuit, a sense amplifier, and a detection circuit. The voltage generator may be operable to controllably supply different differential voltages to the sense amplifier, and the detection circuit may be operable to detect an analog voltage on the output of the sense amplifier.

24 Claims, 10 Drawing Sheets

SENSE AMPLIFIER SOFT-FAIL DETECTION CIRCUIT

BACKGROUND

1. Technical Field

This invention is related to the field of memory implementation, and more particularly to the implementation of sense amplifiers.

2. Description of the Related Art

Computing systems may include one or more systems on a chip (SoC), which may integrate a number of different functions, such as, graphics processing, and memories onto a single integrated circuit. With numerous functions included in a single integrated circuit, chip count may be kept low in mobile computing systems, such as tablets, for example, which may result in a smaller form factor for such mobile computing systems.

Memories typically include a number of data storage cells composed of interconnected transistors. Such data storage cells may be constructed according to a number of different circuit design styles. For example, the data storage cells may be implemented as a single transistor coupled to a capacitor to form a dynamic storage cell. Alternatively, cross-couple inverters may be employed to form a static storage cell, or a floating gate MOSFET may be used to create a non-volatile storage cell.

During the semiconductor manufacturing process, variations in lithography, transistor dopant levels, etc., may result in different electrical characteristics between storage cells and sense amplifiers that are intended to have identical characteristics. Additional variation in electrical characteristics may occur due to aging effects within the transistors as the device is repeatedly operated. These differences in electrical characteristics between transistors can result in data storage cells that output different small signal voltages for the same stored data, and sense amplifiers that respond differently to the same differential input voltage level.

In some cases, the variation of a given sense amplifier may result in the sense amplifier not being able to properly sense the data state of a selected storage cell. Such sense amplifiers may be identified as failures during testing and may require re-design in order to achieve manufacturing yield goals.

SUMMARY OF THE EMBODIMENTS

Various embodiments of circuit for testing a sense amplifier circuit on an integrated circuit are disclosed. Broadly speaking, a circuit and a method are contemplated in which a sense amplifier may receive a differential voltage and may generate an output in response to receiving an enable signal. The output of the sense amplifier may be coupled to a load circuit which may detect an analog voltage level. And an output circuit may select between the output of the sense amplifier and the output of the load circuit to provide a data output signal.

In one embodiment, the load circuit may include a dynamic circuit which may discharge a dynamic node in response to the output of the sense amplifier reaching the analog voltage level. The output circuit may include a multiplex circuit configured to select as the data output signal the output of the load circuit in response to a soft fail test mode enable signal.

In a further embodiment, a voltage generator circuit may generate a plurality of differential voltages that may be selectably applied to the sense amplifier. The voltage generator circuit may include a plurality of resistive voltage dividers to generate the plurality of differential voltages.

BRIEF DESCRIPTION OF THE DRAWINGS

The following detailed description makes reference to the accompanying drawings, which are now briefly described.

Figure 1:
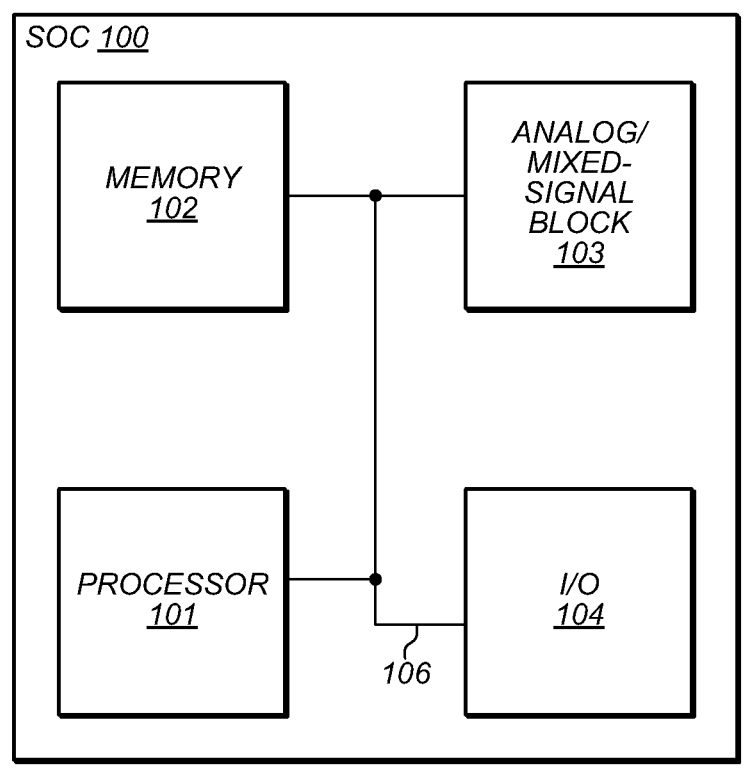
FIG. 1 illustrates an embodiment of a system on a chip.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component. More generally, the recitation of any element is expressly intended not to invoke 35 U.S.C. §112, paragraph six interpretation for that element unless the language "means for" or "step for" is specifically recited.

DETAILED DESCRIPTION OF EMBODIMENTS

A system on a chip (SoC) may include one or more functional blocks, such as, e.g., a microcontroller or a memory, which may integrate the function of a computing system onto a single integrated circuit. Prior to the inclusion of a memory in an SoC design, some or all of circuits, such as sense amplifiers, for example, included in the memory made be fabricated on a test chip or process control module to gather data regarding the performance and yield of the circuits. The embodiments illustrated in the drawings and described below may provide techniques for testing sense amplifiers to determine failure limits of the sense amplifiers and provide data necessary to estimate memory yield for a given sense amplifier design.

A block diagram of an SoC is illustrated in FIG. 1. In the illustrated embodiment, the SoC 100 includes a processor 101 coupled to memory block 102, and analog/mixed-signal block 103, and I/O block 104 through internal bus 105. In various embodiments, SoC 100 may be configured for use in a mobile computing application such as, e.g., a tablet computer or cellular telephone.

Memory block 102 may include any suitable type of memory such as a Dynamic Random Access Memory (DRAM), a Static Random Access Memory (SRAM), a Read-only Memory (ROM), Electrically Erasable Programmable Read-only Memory (EEPROM), or a FLASH memory, for example. It is noted that in the embodiment of an SoC illustrated in FIG. 1, a single memory block is depicted. In other embodiments, any suitable number of memory blocks may be employed.

Analog/mixed-signal block 103 may include a variety of circuits including, for example, a crystal oscillator, a phase-locked loop (PLL), an analog-to-digital converter (ADC), and a digital-to-analog converter (DAC) (all not shown). In other embodiments, analog/mixed-signal block 103 may be configured to perform power management tasks with the inclusion of on-chip power supplies and voltage regulators. Analog/mixed-signal block 103 may also include, in some embodiments, radio frequency (RF) circuits that may be configured for operation with cellular telephone networks.

I/O block 104 may be configured to coordinate data transfer between SoC 101 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, I/O block 104 may be configured to implement a version of Universal Serial Bus (USB) protocol or IEEE 1394 (Firewire®) protocol.

I/O block 104 may also be configured to coordinate data transfer between SoC 101 and one or more devices (e.g., other computer systems or SoCs) coupled to SoC 101 via a network. In one embodiment, I/O block 104 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, I/O block 104 may be configured to implement multiple discrete network interface ports.

Figure 2:
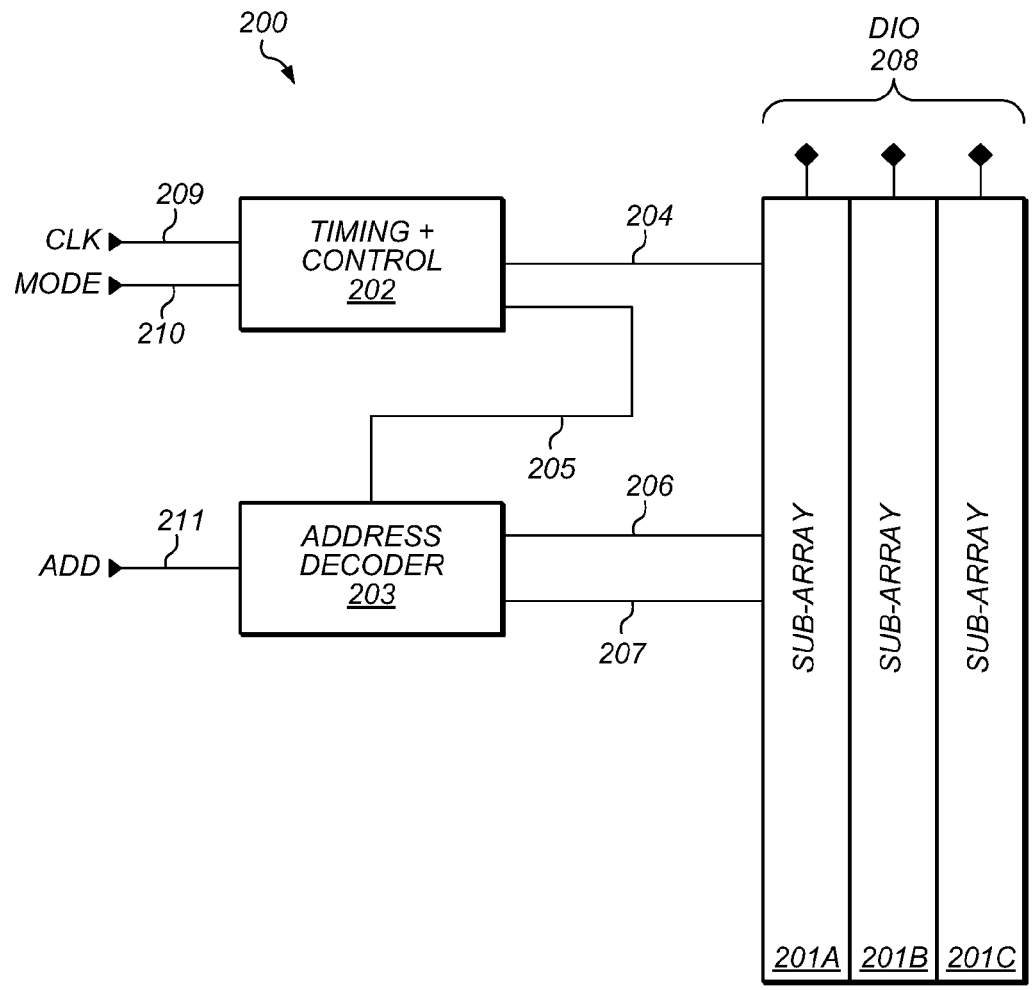
FIG. 2 illustrates an embodiment of a memory.

Turning to FIG. 2, a memory is illustrated according to one of several possible embodiments. In some embodiments, memory 200 may correspond to memory block 102 as depicted in FIG. 1. The illustrated embodiment includes data I/O ports 208 denoted as "dio," an address bus input 211 denoted "add," mode selection input 210 denoted as "mode," and clock input 209 denoted as "clk."

In the illustrated embodiment, memory 200 includes sub-arrays 201a, 201b, and 201c, timing and control unit 202, and address decoder 203. Timing and control unit 202 is coupled to provide a decoder enable signal 205 to address decoder 203, and control signals 204 to sub-arrays 201a-201c. In some embodiments, control signals 204 may include a sense amplifier enable signal and an output enable signal.

Sub-arrays 201a, 201b, and 201c may include, as described below in more detail, one or more data storage cells each of which may be configured to store data or output stored data when selected, sense amplifiers, multiplex circuitry, and input/output circuitry. In other embodiments, additional sub-arrays may be included in memory 200.

Timing and control unit 202 may include a variety of circuits including delay chains, latches, and flip-flops that may be configured to implement a state machine capable of controlling memory 200. In some embodiments, timing and control unit 202 may provide synchronous operation with respect to clock input 209, while in other embodiments, timing and control unit 202 may employed self-timed circuits.

Address decoder 203 is coupled to provide row selection signals 206 and column selection signals 207, in response to the assertion of decoder enable signal 205 and dependent upon the address value encoded on address bus input 211. In some embodiments, address decoder 203 may be configured to latch values on address bus input 211 prior to the generation of row selection signals 206 and column selection signals 207. In other embodiments, column selection signals 207 may be differentially encoded.

Figure 3:
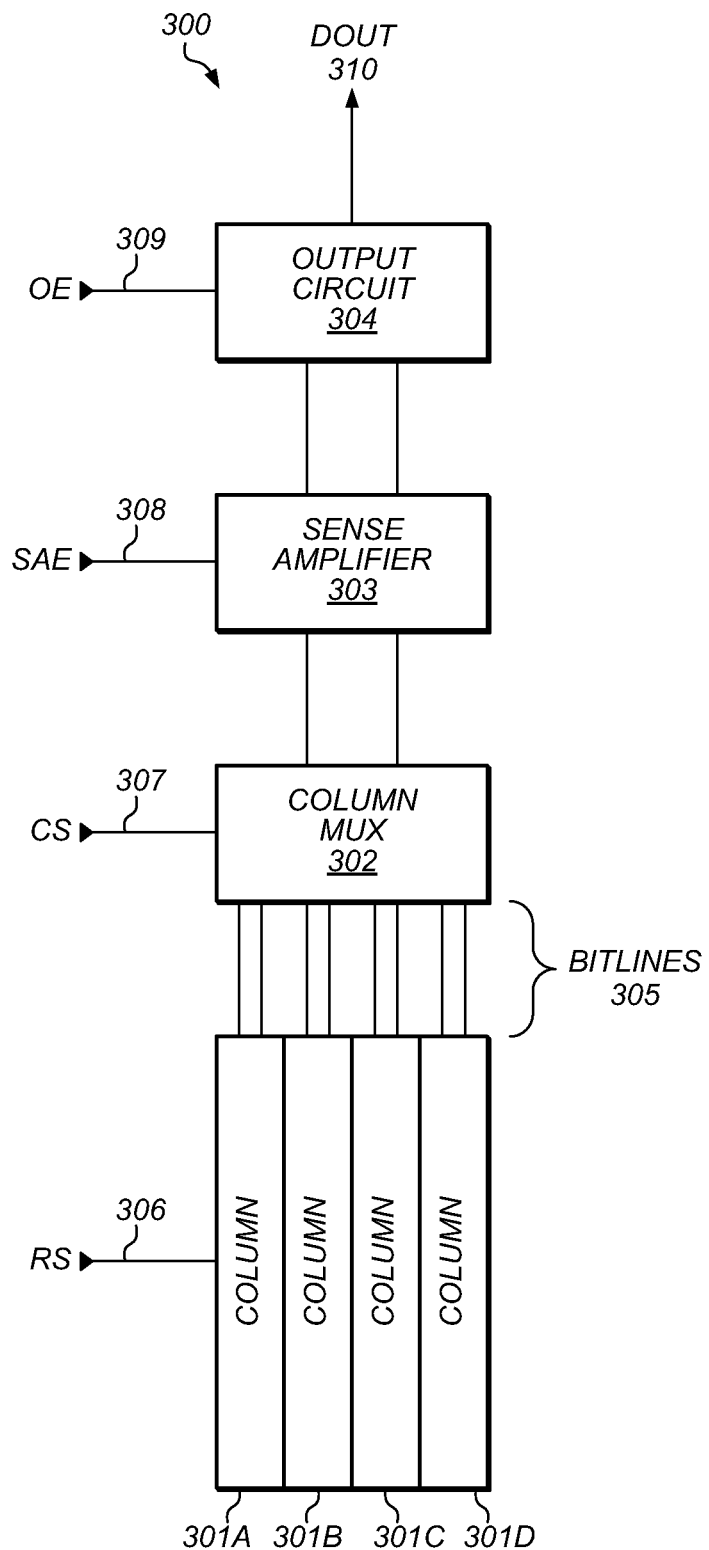
FIG. 3 illustrates an embodiment of a memory sub-array.

FIG. 3 illustrates an embodiment of a memory sub-array which may, in some embodiments, correspond to sub-arrays 201a-201c as depicted in FIG. 2. In the illustrated embodiment, sub-array 300 includes a data output 310 denoted as "dout," an output enable input 309 denote as "oe," and a sense amplifier enable input 308 denoted as "sae." The illustrated embodiment also includes one or more column selection input 307 denoted as "cs" and one or more row selection inputs denoted as "rs."

In the illustrated embodiment, columns 301a, 301b, 301c, and 301d are coupled to the inputs of column multiplexer 302 through bit lines 305. The differentially encoded output of column multiplexer 302 is coupled to the differential inputs of sense amplifier 303, and the output of sense amplifier 303 is coupled to the input of output circuit 304.

Each column 301 may include one or more data storage cells, whose outputs are coupled to a common pair (a true bit line and a complement bit line) of bit lines 305. The data storage cells may be configured such that in response to the assertion of one of row selection inputs 306, a selected one of the data storage cells may output its stored data onto the pair of bit lines. In some embodiments, the data storage cells may be static storage cells, while in other embodiments, the data storage cells may be dynamic storage cells, single-bit or multi-bit non-volatile storage cells, or mask programmable read-only storage cells. It is noted that in some embodiments, the data storage cells may transmit data in a single-ended fashion. In such cases, only a single bit line per column may be required.

In some embodiments, column multiplexer 302 may contain one or more pass gates controllable by column selection inputs 307. The input of each pass gate may be coupled to either the true or complement bit line output from one of columns 301a, 301b, 301c, or 301d. The output of each pass gate coupled to a true bit line may be coupled to the true output of column multiplexer 302 in a wired-OR fashion, and the output of each pass gate coupled to a complement bit line may be coupled to the complement output of column multiplexer 302 in a wired-OR fashion. In other embodiments, column multiplexer 302 may contain one or more logic gates configured to perform the multiplexer selection function.

It is noted that a pass gate (also referred to as a "transmission gate") may include an n-channel metal-oxide-semiconductor field-effect transistor (MOSFET) and a p-channel MOSFET connected in parallel. In other embodiments, a single n-channel MOSFET or a single p-channel MOSFET may be used as a pass gate. It is further noted that, in various embodiments, a "transistor" may correspond to one or more transconductance elements such as a junction field-effect transistor (JFET), for example.

As will be described in more detail below, sense amplifier 303 may use a latch based amplification technique. In other embodiments, sense amplifier 303 may use analog amplification techniques. In cases where the data storage cells of columns 301a-301d transmit data in a single-ended fashion, sense amplifier 303 may be configured to amplify the single-ended data.

Output circuit 304 may be configured to convert the differentially encoded output of sense amplifier 303 into single-ended data prior to output on data output 310. In some embodiments, output enable input 309 may control the impedance of output circuit 304, allowing for a high impedance state such that multiple circuits may be coupled to data output 310 in a wired-OR fashion.

It is noted that the sub-array illustrated in FIG. 3 is merely an example. In other embodiments, different circuit blocks and arrangement of circuit blocks are possible and contemplated.

Figure 4:
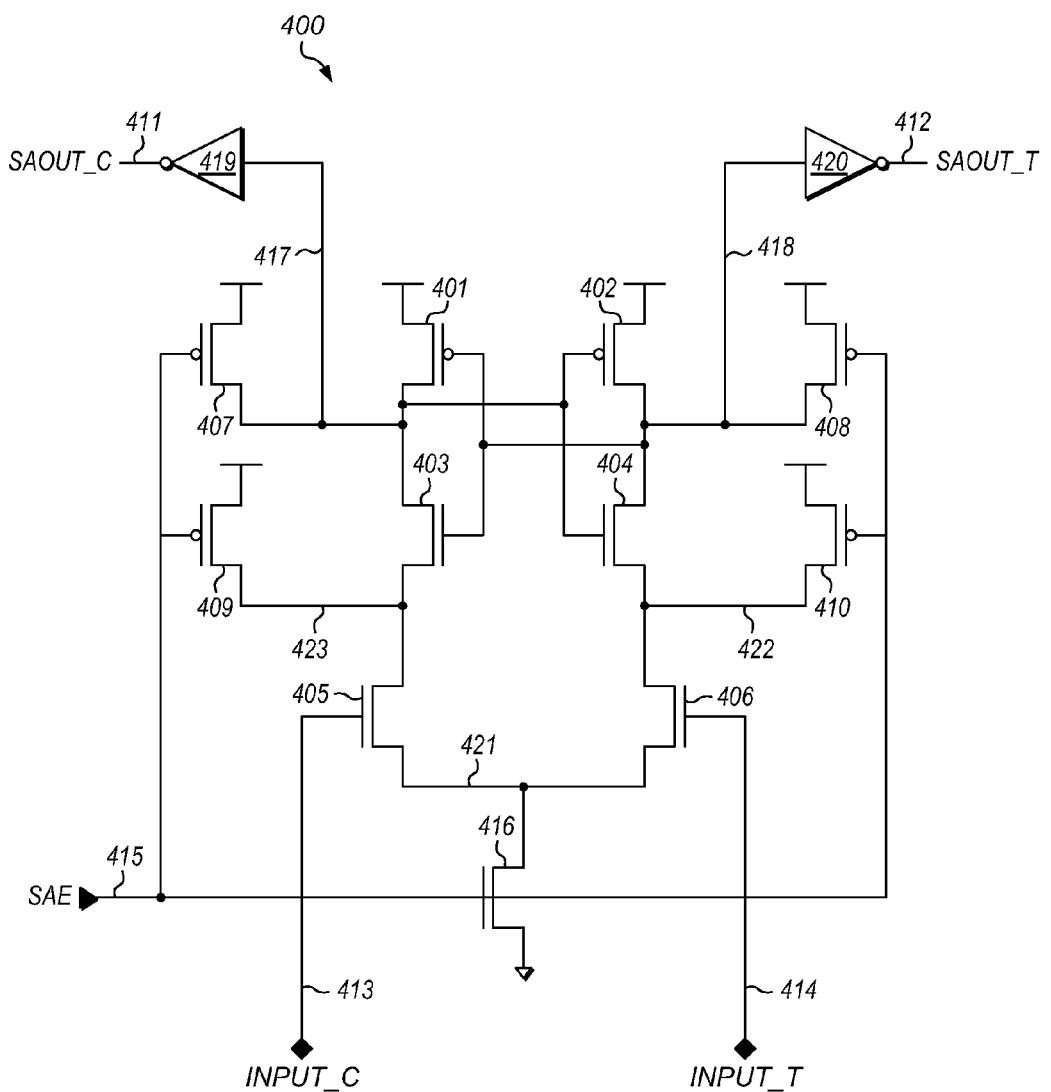
FIG. 4 illustrates an embodiment of a sense amplifier.

FIG. 4 illustrates a sense amplifier according to one of several possible embodiments that may be coupled to receive differentially encoded data from the output of a column multiplexer as described above in reference to FIG. 3. In the illustrated embodiment, sense amplifier 400 includes true amplifier input 414 denoted as "input_t," complement amplifier input 413 denoted as "input_c," and sense amplifier enable input 415 denoted as "sae." Sense amplifier 400 further includes true output 412 and complement output 411 denoted as "saout_t" and "saout_c," respectively.

In the illustrated embodiment, true amplifier input 414 controls gain device 406, and complement amplifier input 413 controls gain device 405. Gain device 406 is coupled to pull-down device 416, feedback device 404, and pre-charge device 410. Gain device 405 is coupled to pull-down device 416, feedback device 403, and pre-charge device 409. Pre-charge devices 409 and 410, and pull-down device 416 are controlled by sense amplifier enable input 415.

Feedback device 404 is further coupled, through node 418, to pull-up device 402, pre-charge device 408, and inverter 420, which is coupled to true output 412. Feedback device 403 is further coupled, through node 417, to pull-up device 401, pre-charge device 407, and inverter 419, which is coupled to complement output 411. Pull-up device 402 and feedback device 404 are controlled by node 417, and pull-up device 401 and feedback device 403 are controlled by node 418. Pre-charge devices 407 and 408 are controlled by sense amplifier enable input 415.

It is noted that static complementary metal-oxide-semiconductor (CMOS) inverters, such as those shown and described herein, may be a particular embodiment of an inverting amplifier that may be employed in the circuits described herein. However, in other embodiments, any suitable configuration of inverting amplifier that is capable of inverting the logical sense of a signal may be used, including inverting amplifiers built using technology other than CMOS. Moreover, it is noted that although pre-charge devices, feedback devices, pull-up devices, and pull-down devices may be illustrated as individual transistors, in other embodiments, any of these devices may be implement using multiple transistors or other suitable circuit elements.

Figure 5:
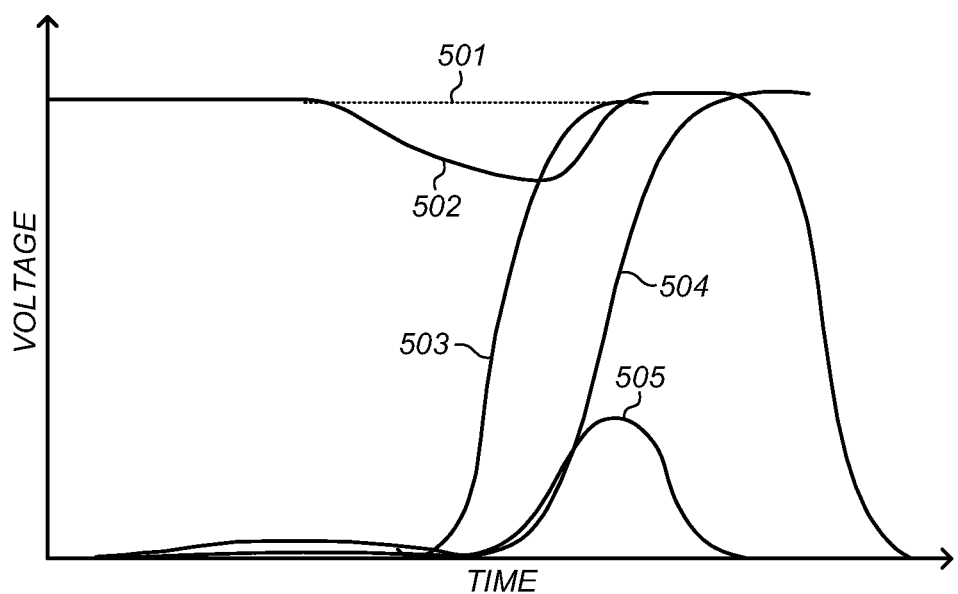
FIG. 5 illustrates possible waveforms for the operation of a sense amplifier.

Turning to FIG. 5, possible waveforms resulting from the operation of sense amplifier 400 are depicted. Referring collectively to FIG. 4 and FIG. 5, both true amplifier input 414 (waveform 501) and complement amplifier input 413 (waveform 502) are initially high, and sense amplifier enable input 415 is low (waveform 503), which turns on pre-charge devices 407, 408, 409, and 410, thereby pre-charging nodes 417, 418, 422, and 423. In response to the pre-charged voltage level on nodes 417 and 418, true output 412 (waveform 504) and complement output 411 (waveform 505) are both low.

At some time later, complement amplifier input 413 (waveform 502) begins to discharge resulting from a selected data storage cell discharging its respective complement bit line, while true amplifier input 414 (waveform 501) remains high. As complement amplifier input 413 (waveform 502) discharges, a difference develops between true amplifier input 414 and complement 413, corresponding to the data stored in the selected data storage cell.

It is noted that "low" refers to a voltage at or near ground and that "high" refers to a voltage level sufficiently large to turn on a n-channel MOSFET and turn off a p-channel MOSFET. In other embodiments, different technology may result in different voltage levels for "low" and "high."

When a sufficient difference in voltage level between true amplifier input 414 and complement amplifier input 413 has developed, sense amplifier enable input 415 (waveform 503) is transitioned high, which causes pull-down device 416 to turn on, discharging node 421. At the same time, in response to sense amplifier enable input 415 switching high, pre-charge devices, 407 through 410 turn off. The high level on true amplifier input 414 causes gain device 406 to turn on, discharging node 422. Since there is a lower voltage on complement amplifier input 413, gain device 405 does not conduct as much as gain device 406, thereby causing node 423 to discharge a slower rate than that of node 422. Regenerative feedback through feedback devices 403 and 404, and pull-up devices 401 and 402, cause node 417 to discharge from its pre-charge state. Inverter 420 then causes true output 412 to transition high (waveform 504). During the period of time the regenerative feedback is being established, node 418 may partially discharge before returning to its pre-charged level. Inverter 419 may generate a momentary signal on complement output 411 (waveform 505) in response to the partial discharge of node 417. Although the previous description of the operation of sense amplifier 400 describes sensing a logical 1, the operation of sense amplifier is fundamentally the same when sensing a logical 0.

The proper operation of sense amplifier 400 is dependent upon the relative transconductance values of gain devices 405 and 406, and those of feedback devices 403 and 404. During manufacture in a semiconductor process, differences in lithography, random dopant fluctuations, variations in stress and strain, may result in different transconductance values between two devices intended to have identical values (commonly referred to as "matched devices"), such as, e.g., gain devices 405 and 406.

Differences in matched devices, may cause a sense amplifier to preferentially detect one logical data state over another. This phenomenon is commonly referred to as "offset" and may require a larger than desired differential voltage in order to overcome the offset of the sense amplifier. In cases where the input differential voltage is insufficient to overcome any offset within a sense amplifier, an incorrect data state may be generated by the sense amplifier, resulting in what is commonly referred to as a "hard failure."

When the input differential voltage is close to a level that may cause a hard failure, a momentary analog voltage level, such as was previously described in regards to waveform 505 of FIG. 5, may appear on the high side of the amplifier. The momentary analog voltage level is commonly referred to as a "glitch." Depending on the voltage level of the glitch, noise sensitive circuits coupled to the output of the sense amplifier may interpret the glitch as a change in logical state and react accordingly, resulting in what is commonly referred to as a "soft failure."

Both types of failures may be detrimental to the operation of a memory. In some embodiments, test circuits may be employed to gather data on one or more sense amplifiers to determine how frequently each type of failure occurs. Such data may be used to modify the design of the sense amplifiers for further revisions of a memory circuit.

Figure 6:
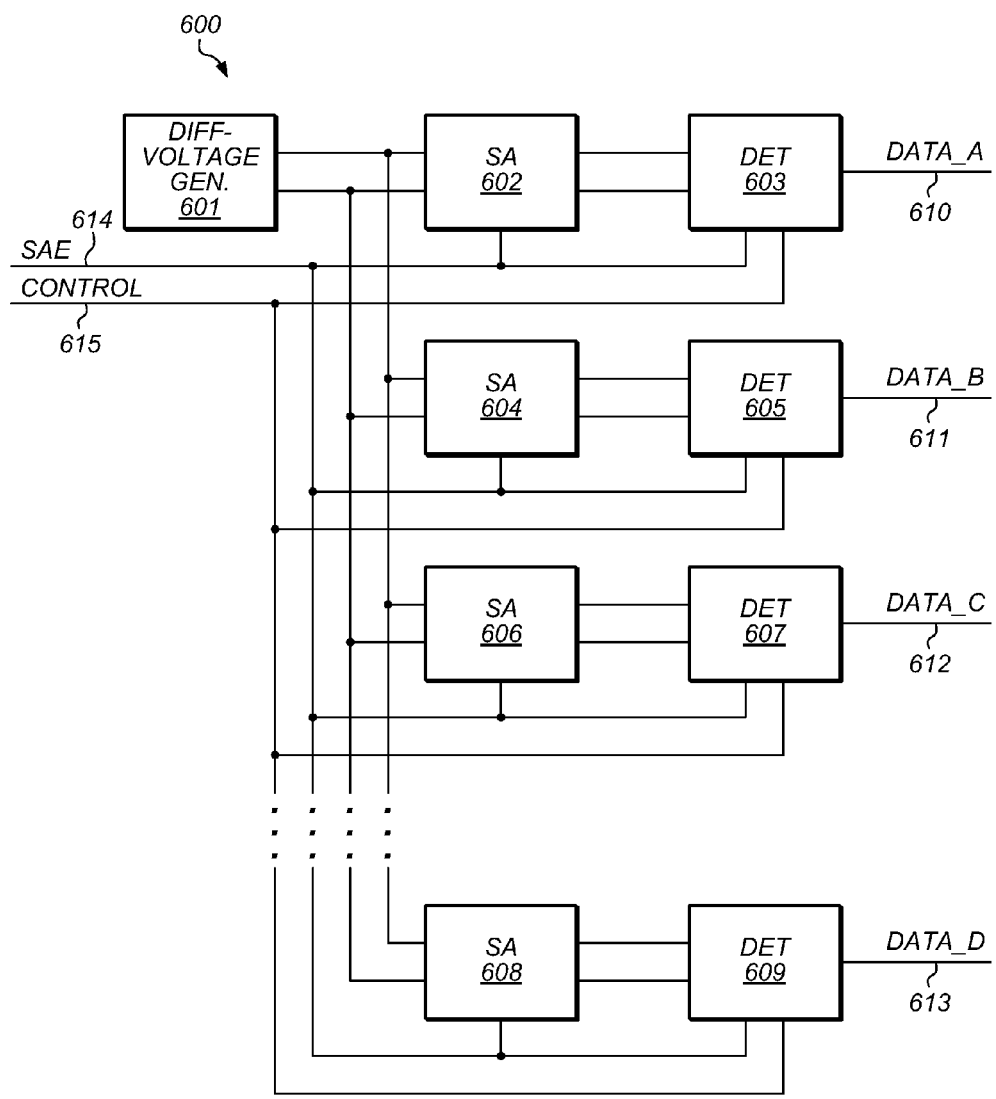
FIG. 6 illustrates an embodiment of a sense amplifier test module.

Turning to FIG. 6, an embodiment of a sense amplifier test circuit is illustrated. The illustrated embodiment includes sense amplifier enable input 614 denoted as "sae," control input 615 denoted as "control," and test outputs 610 through 613 denoted as "data_a," "data_b," "data_c," and "data_d," respectively. In some embodiments, sense amplifier enable input 614 may correspond to sense amplifier enable input 415 of sense amplifier 400 as depicted in FIG. 4.

In the illustrated embodiments, differential voltage generator 601 is coupled to sense amplifiers 602, 604, 606, and 608, which are controlled by sense amplifier enable input 614. Sense amplifier 602 is further coupled to detection circuit 603, and sense amplifier 604 is further coupled to detection circuit 605. Additionally, sense amplifier 606 is further coupled to detection circuit 607, and sense amplifier 608 is further coupled to detection circuit 609. Each of detection circuits 603, 605, 607, and 609 are controlled by control input 615, and coupled to test outputs 610 through 613, respectively. It is noted that although four sense amplifiers and four detection circuits are illustrated, in other embodiments, different numbers and configurations of sense amplifiers and detection circuits are possible.

Differential voltage generator 601 may be configured to provide a range of differential voltages to sense amplifiers 602, 604, 606, and 608. In some embodiments, differential voltage generator 601 may include one or more resistive voltage dividers configured to generate the range of differential voltages. In other embodiments, differential voltage generator 601 may include one or more voltage reference circuits, such as a bandgap reference circuit, for example, configured to generate the range of differential voltages.

Sense amplifiers 602, 604, 606, and 608 may be configured to employ a latch-based amplification method such as sense amplifier 400 as depicted in FIG. 4, for example. In other embodiments, sense amplifiers 602, 604, 606, and 608 may include analog amplification circuits such as a differential amplifier configured to provide either a single-ended or differential output.

Detection circuits 603, 605, 607, and 609, as described in more detail below, may be configured to detect either hard sense amplifier failures of soft sense amplifier failures dependent upon control input 615. In some embodiments, control input 615, may include multiple signals configured to operate one or more multiplex circuits included in detection circuits 603, 605, 607, and 609.

Sense amplifier test circuit 600 may, in some embodiments, be included in a process control module that may be fabricated in conjunction with integrated circuits to monitor process parameters such as, e.g., metal layer resistances, inter-metal dielectric thickness, and the like. In other embodiments, all or portions of sense amplifier test circuit 600 may be included in an integrated circuit such as, SoC 100 as depicted in FIG. 1, for example. In some embodiments, test outputs 610 through 613 may be stored in latches and flip-flops (not shown) and accessed through a scan chain or similar test circuit.

Data resulting from the operation of sense amplifier test circuit 600 may be used to perform statistical analysis on the differential voltage input requirements of sense amplifiers 602, 604, 606, and 608, such as, curve fitting to various probability density functions, calculation of a probability of encountering a hard or soft failure, etc. In some embodiments, test conditions, such as, e.g., power supply voltage, temperature, etc., may be varied and data gather to determine the effect of such test conditions on sense amplifier performance.

Figure 7:
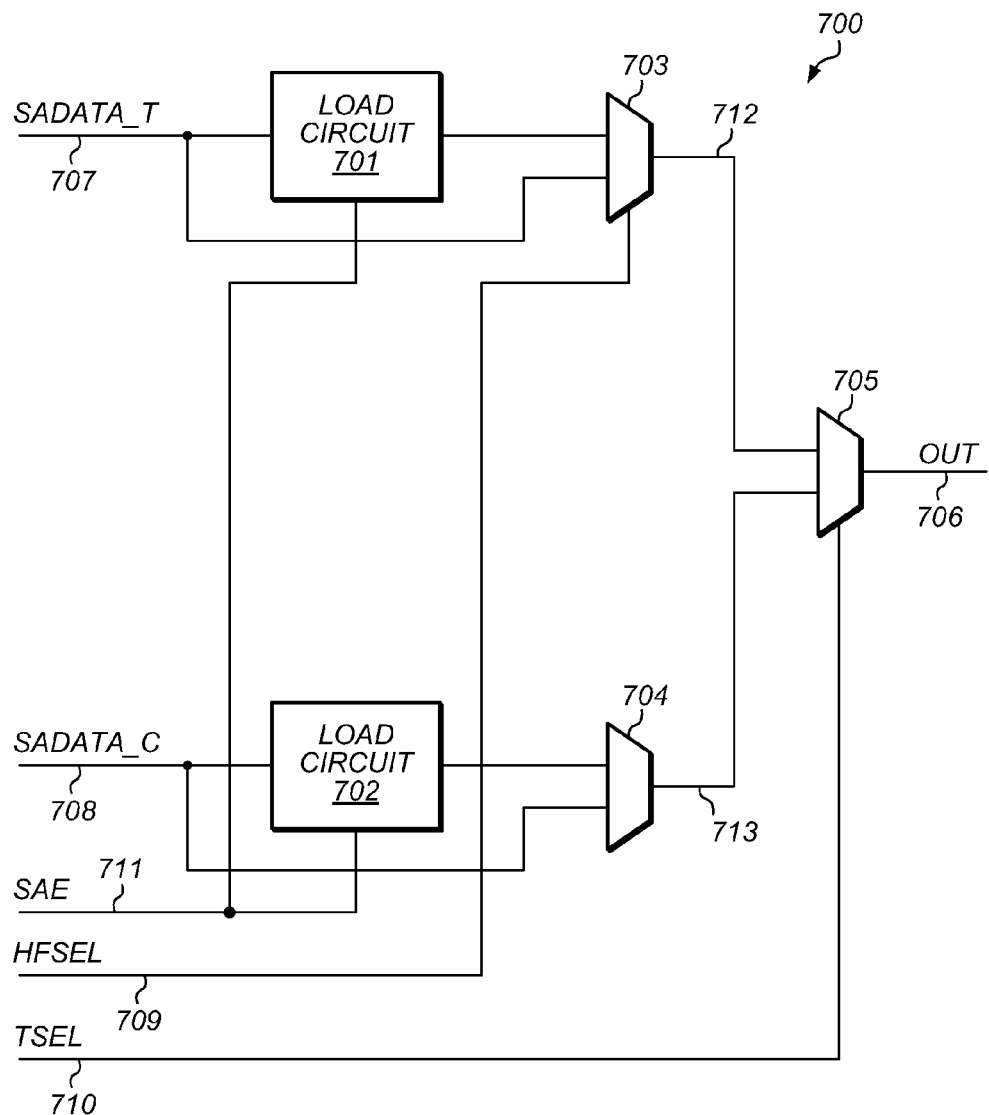
FIG. 7 illustrates a block diagram of a sense amplifier test circuit.

An embodiment of a detection circuit according one of several embodiments is illustrated in FIG. 7. The illustrated embodiment includes a true sense amplifier data input 707 denoted as "sadata_t," a complement sense amplifier data input 708 denoted as "sadata_c," a hard failure detection selection input 709 denoted as "hfsel," a true data selection input 710 denoted as "tsel," a sense amplifier enable input 711 denoted as "sae," and a test data output 706 denoted as "out."

In the illustrated embodiment, true sense amplifier data input 707 is coupled to load circuit 701 and multiplex circuit 703. The output of load circuit 701 is coupled to multiplex circuit 703, and the output of multiplex circuit 703 is coupled to multiplex circuit 705 via true data output signal 712. Complement sense amplifier input 708 is coupled to load circuit 702 and multiplex circuit 704. The output of load circuit 702 is coupled to multiplex circuit 704, and the output of multiplex circuit 704 is coupled to multiplex circuit 705 via complement data output signal 713.

Multiplex circuits 703, 704, and 705 may include a plurality of tri-state buffers whose outputs are coupled together in a wired-OR fashion, and whose control input is dependent upon one of the selection inputs 709 or 710. In some embodiments, multiplex circuits 703, 704, and 705 may include a plurality of logic gates configured to implement the desired multiplex function. Although multiplex circuits 703, 704, and 705 are illustrated as multiplex circuits in FIG. 7, in other embodiments, any suitable output circuit configured to generate an output dependent on one or more data inputs (e.g., true sense amplifier data 707, and the output of load circuit 701) responsive to a selection input such as, e.g., hard fail detection selection input, may be employed.

Load circuits 701 and 702 may be configured to detect an analog voltage level on sense amplifier data inputs 707 and 708, respectively. In some embodiments, load circuits 701 and 702 may include a voltage comparator and a reference circuit. In other embodiments, load circuits may include a dynamic circuit, as described below in more detail, configured to discharge a pre-charged dynamic node upon the detection of a pre-determined analog voltage level on the sense amplifier data inputs 707 and 708.

During operation, sense amplifier enable input 711 is transition from low to high, thereby activating load circuits 701 and 702, which respond to the voltages on true sense amplifier data input 707 and complement sense amplifier data input 708, respectively. When one of the load circuits receives a sufficiently high voltage level from its corresponding sense amplifier data input, the load circuit generates a high logic level output. Dependent on the voltage levels present on the sense amplifier data inputs, one or both of the load circuits may generate a high logic level output.

To detect a soft failure in the sense amplifier coupled to the input of detection circuit 700, hard failure selection input 709 is set to a low logic level, which causes multiplex circuits 703 and 704 to select for output to multiplex circuit 705, the outputs of load circuit 701 and 702, respectively. The state of true data selection input 710 is dependent upon the polarity of data to be sensed. For example, when the data to be sensed is a logical 1, true sense amplifier data 707 will transition to a high logic level and complement sense amplifier data 708 may transition to an analog voltage level. The output of load circuit 701 will be a high logic level in response to the high logic level on true sense amplifier data 707. The output of load circuit 702 may transition to a high logic level is the analog voltage level present on complement sense amplifier data 708 is sufficiently large, thereby denoting a soft failure. True data selection input 710 is accordingly set low so that test data output 706 outputs the generated high logic level from load circuit 702. In the case when a logical 0 is to be sensed, the logical sense of true data selection input 710 is reversed so that a sufficiently large analog voltage level on true sense amplifier data 707 will result in a high logic level on test data output 706.

It is noted that the detection circuit illustrated in FIG. 7 is merely an example. In other embodiments, different circuit blocks and connectivity between blocks is possible and contemplated.

Figure 8:
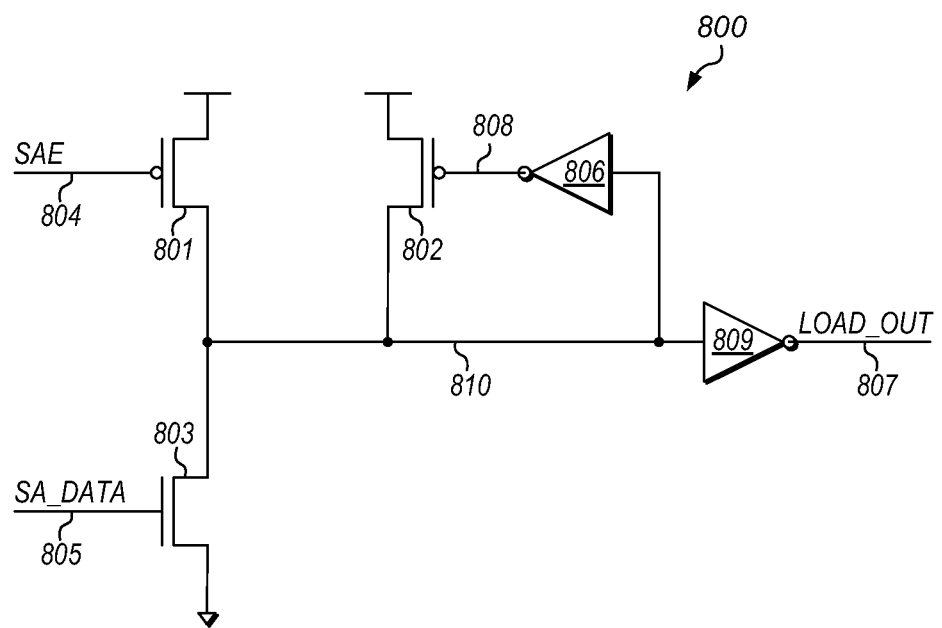
FIG. 8 illustrates an embodiment of a sense amplifier load circuit with dedicated feedback inverter.

An embodiment of a sense amplifier load circuit is illustrated in FIG. 8. In some embodiments, load circuit 800 may correspond to load circuits 701 and 702 as depicted in reference to FIG. 7. The illustrated embodiment includes sense amplifier enable input 804 denoted as "sae," sense amplifier data input 805 denoted as "sa_data," and load circuit output 807 denoted as "load_out."

In the illustrated embodiment, sense amplifier enable 804 controls pre-charge device 801, which is coupled, through dynamic node 810, to pull-down device 803, keeper device 802, inverter 806, and inverter 809. Inverter 809 is further coupled to load circuit output 807. Pull-down device 803 is controlled by sense amplifier data 805, and keeper device 802 is controlled by the output of inverter 806 through node 808. In various embodiments, additional inverters or buffers (not shown) may be coupled the output of inverter 809 that may provide additional gain for driving larger capacitive loads.

During operation, sense amplifier enable 804 and sense amplifier data 805 are both initially low causing dynamic node 810 to be pre-charged high. The high logic level on dynamic node 810 is inverted by inverters 806 and 809, resulting in a low logic level on node 808 and load circuit output 807, respectively. When sense amplifier enable is set high, pre-charge device 801 turns off. At this point, the operation of load circuit 800 is dependent upon the voltage level on sense amplifier data 805. When the voltage level reaches a sufficiently large level, pull-down device 803 sinks a current from dynamic node 810 larger than the current being sourced to load circuit output 807 by keeper device 802, resulting in the voltage level on dynamic node 810 to drop. When the voltage level on dynamic node 810 drops below the switching threshold of inverter 806, the output of inverter 806 transitions from a low logic level to a high logic level, turning off keeper device 802. In a similar fashion, when the voltage level on dynamic node 810 drops below the switching threshold of inverter 809, load circuit output 807 may transition to a high logic level. Load circuit 800 will remain in this state until both sense amplifier data 805 and sense amplifier enable input 804 return to a low logic level, resulting in the pre-charging of dynamic node 810.

The voltage level that triggers the discharge of dynamic node 810 is dependent upon the relative transconductance values of pull-down device 803 and keeper device 802. In some embodiments, pull-down device 803 and keeper device 802 may be MOSFETs, and their respective transconductance values may be adjusted by varying the physical dimensions (device width and channel length) of the devices. In other embodiments, pull-down device 803 and keeper device 802 may be each be implemented as a plurality of devices in series to reduce the device's transconductance value.

It is noted that the load circuit depicted in FIG. 8 is merely an example. In other embodiments, different configurations of devices are possible.

Figure 9:
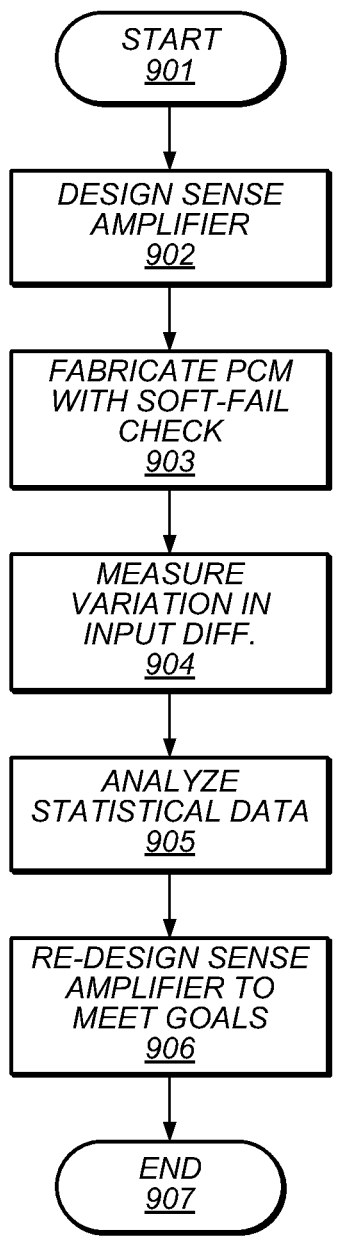
FIG. 9 illustrates a flowchart of an example method of designing a sense amplifier.

Turning to FIG. 9, a flowchart of a method for designing a sense amplifier is illustrated. The method begins in block 901. An initial design for a sense amplifier is then generated (block 902). Generating the initial design may include such steps as schematics capture, mask design and physical verification, circuit extraction, and electrical simulation. The designed sense amplifier may then be included in a process control module or test chip along with supporting test circuits such as, sense amplifier test circuit 600 as depicted in FIG. 6, for example. The process control module may then be fabricated (block 903).

Once the process control module has been fabricated, the included sense amplifiers are tested and the variation in required input differential voltage levels may be measured for both hard failures and soft failures (block 904). In some embodiments, the variation may be measured under a variety of test conditions, such as, e.g., power supply voltage. The measured data may then be analyzed using statistical techniques (block 905). The statistical analysis may include curve fitting of the data to a known statistical distribution, such as, e.g., a Gaussian distribution, the calculation of probabilities for encountering hard or soft failures, and an estimation of the yield impact the sense amplifier design may have on a memory circuit in which the sense amplifier design is employed. The sense amplifier circuit may be then re-designed based upon the results of the analysis of the measured data (block 906). Device sizes, mask design of the circuit, etc., may be changed during the re-design process in order to achieve desired performance and yield goals. The method then concludes in block 907. It is noted that the method illustrated in FIG. 9 is merely an example, and that in some embodiments, some or all of the operations illustrated in FIG. 9 may occur in a different order, or may occur concurrently rather than sequentially.

Figure 10:
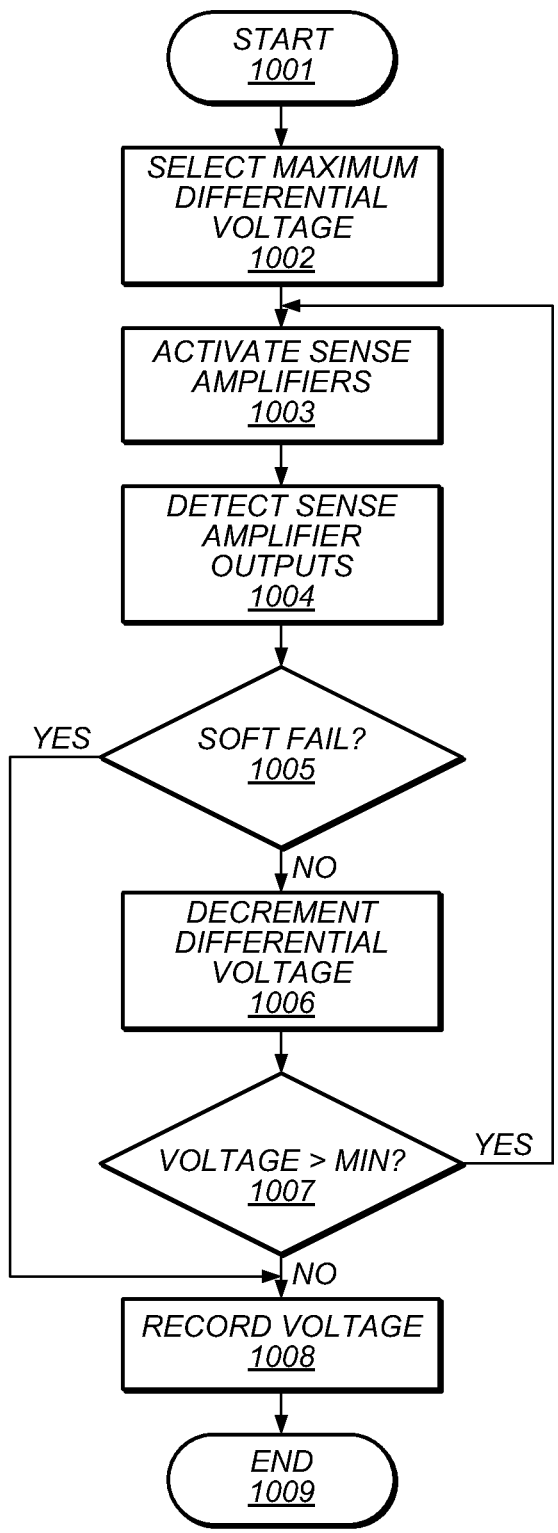
FIG. 10 illustrates a flowchart of an example method for detecting soft failures in a sense amplifier.

A flowchart of a method to operate the test circuit illustrated in FIG. 6 to gather data on sense amplifier soft failures is illustrated in FIG. 10. Referring collectively to FIG. 6 and the flowchart of FIG. 10, the method begins in block 1001. Differential voltage generator 601 is then operated to provide a maximum differential voltage (block 1002). Sense amplifiers 602, 604, 606, and 608 are then activated (block 1003), and their respective outputs detected by detection circuits 603, 605, 607, and 609 (block 1004). The method then depends on whether or not a soft failure was detected for one or more of sense amplifiers 602, 604, 606, and 608 (block 1005). When a soft failure is detected, the differential voltage that triggered the soft failure is recorded (block 1008), and the method concludes (block 1009).

When no soft failure is detected, differential voltage generator 601 is operated to reduce the differential voltage being supplied to sense amplifiers 602, 604, 606, and 608 (block 1006). The operation then depends on a comparison of the differential voltage to a pre-determined minimum differential voltage (block 1007). When the differential voltage less than or equal to the pre-determined minimum differential voltage, the differential voltage is recorded (block 1008). The operation then concludes in block 1009.

When the differential voltage is greater than the pre-determined minimum differential voltage, sense amplifiers 602, 604, 606, and 608 are re-activated (block 1003), and the operation proceeds from block 1003 are described above. It is noted that operations illustrated in FIG. 10 are executed in a sequential fashion. In some embodiments, the operations may occur concurrently or in a different order than the example method illustrated in FIG. 10.

Numerous variations and modifications will become apparent to those skilled in the art once the above disclosure is fully appreciated. It is intended that the following claims be interpreted to embrace all such variations and modifications.

What is claimed is:

1. An apparatus, comprising:
a voltage generator circuit configured to generate a plurality of differential voltages;
a sense amplifier configured to receive a given one of the plurality of differential voltages and generate an output signal in response to receiving an enable signal;
a load circuit coupled to the output of the sense amplifier and configured to detect an analog voltage level of the output signal in response to receiving the enable signal; and
an output circuit configured to generate a data output signal dependent upon the output of the load circuit and the output of the sense amplifier.

2. The apparatus of claim 1, wherein the load circuit comprises a voltage reference and a comparator circuit configured to compare the output signal to the reference voltage.

3. The apparatus of claim 1, wherein the output circuit comprises a multiplex circuit configured to select the output of the sense amplifier as the data output signal responsive to a hard fail test mode signal.

4. The apparatus of claim 1, wherein the load circuit comprises a dynamic circuit configured to discharge a dynamic node in response to the output signal reaching the analog voltage level.

5. The apparatus of claim 4, wherein the dynamic circuit comprises a pull-down device, and a keeper device, wherein the transconductance values of the pull-down device and the keeper device are such that the dynamic node discharges in response to the output signal reaching the analog voltage level.

6. A method, comprising:
designing a sense amplifier test circuit including one or more sense amplifier circuits;
fabricating the sense amplifier test circuit on a semiconductor manufacturing process;
measuring a minimum differential voltage requirement for each one of the one or more sense amplifier circuits included in the sense amplifier test circuit;
analyzing the measured minimum differential voltage requirements; and
modifying the design of the sense amplifier dependent upon the analysis.

7. The method of claim 6, wherein the sense amplifier test circuit further includes one or more detection circuits, wherein each detection circuit is coupled to the output of a respective one of the one or more sense amplifiers.

8. The method of claim 7, wherein measuring the minimum differential voltage requirement comprises detecting a soft failure for each one of the one or more sense amplifier circuits.

9. The method of claim 6, wherein analyzing the measured minimum differential voltage requirements comprises performing a curve fit of the measured minimum differential voltage requirements to a pre-determined probability density function.

10. The method of claim 9, wherein analyzing the measure minimum differential voltage requirements further comprises estimating the yield of the sense amplifier circuit.

11. A system, comprising:
one or more sense amplifier circuits;
a voltage generator circuit configured to selectably supply a differential voltage of a plurality of differential voltages to at least some of the one or more sense amplifier circuits; and
one or more detection circuits, wherein each of the one or more detection circuits is coupled to a respective one of the one or more sense amplifiers circuits;
wherein each of the one or more sense amplifier circuits is configured to generate an output signal that is dependent upon the applied differential voltage in response to receiving an enable signal; and
wherein each of the one or more detections circuits is configured to detect an analog voltage level on the output signal of the respective sense amplifier.

12. The system of claim 11, wherein the voltage generator circuit comprises one or more resistive voltage dividers configured to generate the plurality of differential voltages.

13. The system of claim 11, wherein the voltage generator circuit comprises a one or more voltage reference circuits configured to generate the plurality of differential voltages.

14. The system of claim 11, wherein each one of the detection circuits comprises a dynamic circuit configured to discharge a dynamic node in response to the detection of the analog voltage level.

15. The system of claim 11, further comprising one or more latches, wherein each one of the latches is configured to store an output of a respective one of the one or more detection circuits.

16. A memory, comprising:
a plurality of memory cells;
a voltage generator circuit configured to generate a plurality of differential voltages;
a plurality of sense amplifier circuits; and
a plurality of test circuits, wherein each test circuit of the plurality of test circuits is coupled to a respective one of the plurality of sense amplifiers.

17. The memory of claim 16, wherein each of the plurality of test circuits comprises a load circuit configured to detect an analog voltage level on an output of the respective one of the plurality of sense amplifiers.

18. The memory of claim 17, wherein the load circuit comprises a dynamic circuit configured to discharge a dynamic node in response the output of the respective one of the plurality of sense amplifiers achieving the analog voltage level.

19. The memory of claim 16, wherein the voltage generator circuit is further configured to selectably apply a differential voltage of the plurality of differential voltages to each of the plurality of sense amplifiers in response to receiving a test signal.

20. A method, comprising:
selecting a first differential voltage level;
activating a sense amplifier circuit configured to receive the selected first differential voltage;
detecting, by a detection circuit, an analog voltage level on an output of the sense amplifier;
determining a soft failure dependent upon the detected analog voltage;
storing the differential voltage level dependent upon the determination; and
selecting a second differential voltage level dependent upon the determination.

21. The method of claim 20, wherein the second differential voltage level is lower than the first differential voltage level.

22. The method of claim 20, wherein detecting the analog voltage level comprises comparing a voltage level on the output of the sense amplifier to a pre-determined reference voltage level.

23. The method of claim 20, wherein detecting the analog voltage level comprises discharging a dynamic circuit node in response the output of the sense amplifier reaching a pre-determined voltage level.

24. The method of claim 21, wherein determining a soft failure comprises selecting between the output of the sense amplifier and an output of the detection circuit.

* * * * *